(12) United States Patent
Do

(10) Patent No.: US 8,169,837 B2
(45) Date of Patent: May 1, 2012

(54) SEMICONDUCTOR MEMORY DEVICE AND METHOD FOR GENERATING BIT LINE EQUALIZING SIGNAL

(75) Inventor: Chang-Ho Do, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 79 days.

(21) Appl. No.: 12/345,636

(22) Filed: Dec. 29, 2008

(65) Prior Publication Data

US 2010/0008162 A1 Jan. 14, 2010

(30) Foreign Application Priority Data

Jul. 9, 2008 (KR) .......................... 10-2008-0066596

(51) Int. Cl.
*G11C 7/00* (2006.01)

(52) U.S. Cl. .............. 365/189.11; 365/203; 365/189.09; 365/230.06

(58) Field of Classification Search ............. 365/189.11, 365/189.09, 203, 230.06
See application file for complete search history.

(56) References Cited

U.S. PATENT DOCUMENTS

| | | | | |
|---|---|---|---|---|
| 5,623,446 A * | 4/1997 | Hisada et al. | ............ | 365/189.11 |
| 6,667,921 B2 * | 12/2003 | Park | .............................. | 365/203 |
| 6,744,689 B2 * | 6/2004 | Itou | ............................... | 365/228 |
| 6,845,051 B2 * | 1/2005 | Komura | ........................ | 365/203 |
| 2007/0070746 A1 * | 3/2007 | Han | ............................. | 365/203 |

FOREIGN PATENT DOCUMENTS

| | | |
|---|---|---|
| KR | 1020030058287 A | 7/2003 |
| KR | 1020070036576 A | 4/2007 |

OTHER PUBLICATIONS

U.S. Appl. No. 12/345,692.*
Notice of Allowance issued from Korean Intellectual Property Office on Jan. 26, 2010.
Notice of Preliminary Rejection issued from Korean Intellectual Property Office on Jul. 28, 2009 with an English Translation.

* cited by examiner

*Primary Examiner* — Hoai V Ho
*Assistant Examiner* — Kretelia Graham
(74) *Attorney, Agent, or Firm* — IP & T Group LLP

(57) ABSTRACT

A bit line equalizing signal generator of a semiconductor memory device uses a supply voltage and a pumping voltage in stages during a period where a bit line equalizing signal is enabled, thereby enhancing an equalizing speed and an active speed while minimizing power consumption. The semiconductor memory device includes a bit line equalizing signal generating unit configured to drive an output terminal with the supply voltage during a first activation period at the beginning of the period where the bit line equalizing signal is enabled, and to drive the output terminal with the pumping voltage higher than the supply voltage during a second activation period following the first activation period, thereby outputting the bit line equalizing signal, and a bit line equalizing unit configured to equalize a bit line pair in response to the bit line equalizing signal.

24 Claims, 8 Drawing Sheets

|  | FIRST PERIOD (1st PERIOD) INACTIVATION PERIOD OF BLEQ | SECOND PERIOD (2nd PERIOD) 1st ACTIVATION PERIOD OF BLEQ | THIRD PERIOD (3rd PERIOD) 2nd ACTIVATION PERIOD OF BLEQ | FOURTH PERIOD (4th PERIOD) 3rd ACTIVATION PERIOD OF BLEQ |
|---|---|---|---|---|
| PULL DOWN (MN4) | ON | OFF | OFF | OFF |
| PULL UP 1 (MP4) | OFF | ON | OFF | ON |
| PULL UP 2 (MP5) | OFF | OFF | ON | OFF |

SEMICONDUCTOR MEMORY DEVICE AND METHOD FOR GENERATING BIT LINE EQUALIZING SIGNAL

CROSS-REFERENCE TO RELATED APPLICATIONS

The present invention claims priority of Korean patent application number 10-2008-0066596, filed on Jul. 9, 2008, which is incorporated by reference in its entirety.

BACKGROUND OF THE INVENTION

The present invention relates to semiconductor design technology, and more particularly, to technology of generating a bit line equalizing signal to equalize a bit line pair of a semiconductor memory device.

A semiconductor memory device performs an internal amplifying process on data read out of a memory cell and transfers the amplified data, thereby outputting the data stored in the memory cell to the outside thereof. In general, the operation of amplifying the data of the memory cell is performed in a bit line amplifier (BLSA), and the BLSA performs the amplifying operation in response to an active command ACTIVE. In order to amplify data of another memory cell after amplifying data of a certain memory cell through the active operation, a precharge operation should be performed in response to a precharge command PRECHARGE prior to performing another active operation for the data of that other memory cell. Therefore, in order to enhance the performance of the semiconductor memory device, it is required to improve the speed of the precharge operation. That is, it is requited to improve performances such as row precharge or RAS precharge.

Particularly, it is important to improve the performance of the operation of equalizing a bit line pair connected to memory cells among several internal operations performed during the RAS precharge. The operation of equalizing the bit line pair is an operation of setting the bit line pair to an identical potential level, and a precharge voltage having a certain potential level is used for the equalizing operation.

FIG. 1 illustrates a diagram of a conventional semiconductor memory device.

Referring to FIG. 1, the semiconductor memory device includes a memory cell 110, a bit line equalizing unit 120 for equalizing a bit line pair BL and BLB, a bit line equalizing signal generating unit 130 for generating a bit line equalizing signal BLEQ to control the bit line equalizing unit 120, a bit line amplifying unit 140 for amplifying data of the memory cell 110, and a bit line amplification driving unit 150 for controlling the bit line amplifying unit 140. For the reference, FIG. 1 shows one memory cell of the semiconductor memory device, but practically the semiconductor memory device includes an array constructed by a plurality of memory cells connected to a word line WL and a bit line BL.

Herein, the memory cell 110 includes a cell capacitor C for storing the data and a cell transistor MN0, wherein the cell transistor MN0 includes one end N1 connected to the bit line BL, the other end N2 connected to the cell capacitor C, and a gate G connected to the word line WL.

The bit line equalizing unit 120 includes NMOS transistors MN1, MN2 and MN3 to supply a precharge voltage VBLP to the bit line pair BL and BLB. As a semiconductor memory device is highly integrated and miniaturized, it is difficult to secure a region where the bit line equalizing unit 120 is disposed since the bit line equalizing unit 120 is disposed in a narrow region between memory cells. As a result, it is also difficult to secure a desired width of the NMOS transistors constructing the bit line equalizing unit 120. Thus, in order to improve the operating speed of the bit line equalizing unit 120 having a limited size, it is required to raise the potential level of the bit line equalizing signal BLEQ controlling the NMOS transistors MN1, MN2 and MN3 of the bit line equalizing unit 120. However, the raising of the potential level of the bit line equalizing signal BLEQ results in increasing power consumption in the bit line equalizing signal generating unit 130.

The semiconductor memory device illustrated in FIG. 1 operates as follows.

FIG. 2 describes a timing diagram for an operation of the semiconductor device illustrated in FIG. 1.

Referring to FIG. 2, an enable signal EN is enabled as a high level signal in response to an active signal, and disabled as a low level signal in response to a precharge signal. The enable signal EN has the high level during an active period. If the enable signal EN is enabled as the high level, a word line enable signal WL is enabled as a high level and a cell transistor MN0 is turned on. Thus, the data stored in the cell capacitor C is transferred onto the bit line BL. Since the data transferred onto the bit line BL has a weak signal level, the bit line amplification driving unit 150 transfers a bit line amplifying signal SAEN enabled as a high level to the bit line amplifying unit 140, and the bit line amplifying unit 140 amplifies the data on the bit line BL and outputs the amplified data to the bit line pair BL and BLB. In general, the bit line amplifying unit 140 is constructed with a cross-coupled differential amplifier whose input terminals are connected to the bit line pair BL and BLB.

Meanwhile, the bit line equalizing signal BLEQ transits to a low level so as to inactivate the bit line equalizing unit 120 during the active operation. On the other hand, the bit line equalizing signal BLEQ transits to a high level so as to activate the bit line equalizing unit 120 during the precharge operation. The activated bit line equalizing unit 120 equalizes voltage levels of the bit line pair BL and BLB to the precharge voltage level VBLP.

In the prior art, in order to improve a bit line equalizing speed, the bit line equalizing signal generating unit 130 drives its output terminal with a pumping voltage having a higher potential level than that of an external supply voltage and the bit line equalizing signal BLEQ provided through the output terminal of the bit line equalizing signal generating unit 130 is used to control the bit line equalizing unit 120. However, this technique has a disadvantage of increasing current consumption required to transfer the bit line equalizing signal BLEQ. Moreover, the pumping voltage obtained by boosting the external supply voltage has very low efficiency and, thus, the current consumption is substantially increased as the time using the pumping voltage becomes longer. Compared to the case of using the external supply voltage, a longer time is required in dropping the bit line equalizing signal BLEQ having the pumping voltage level to a ground voltage level and, thus, an inactivation time of the bit line equalizing unit 120 is delayed in the active operation. This means that an activation time of the word line WL should be delayed as much as the delay of the inactivation time of the bit line equalizing unit 120, thereby performing a stabilized amplifying operation. As a result, there is produced a side effect which a processing time of the active operation becomes much longer.

SUMMARY OF THE INVENTION

Embodiments of the present invention are directed to providing a semiconductor memory device of improving power consumption and the equalizing speed of a bit line pair.

Another object of the present invention is to provide a method of generating a bit line equalizing signal to improve active operation and power consumption of a semiconductor memory device.

In accordance with an aspect of the present invention, there is provided a semiconductor memory device including: a bit line equalizing signal generating unit configured to drive an output terminal with a first supply voltage during a first activation period at the beginning of a period where a bit line equalizing signal is enabled, and to drive the output terminal with a second supply voltage higher than the first supply voltage during a second activation period following the first activation period, thereby outputting the bit line equalizing signal; and a bit line equalizing unit configured to equalize a bit line pair in response to the bit line equalizing signal.

In accordance with another aspect of the present invention, there is provided a semiconductor memory device including: a bit line equalizing signal generating unit configured to drive an output terminal with a first supply voltage during a first activation period at the beginning of a period where a bit line equalizing signal is enabled, to drive the output terminal with a second supply voltage higher than the first supply voltage during a second activation period following the first activation period, and to drive the output terminal with the first supply voltage during a third activation period following the second activation period, thereby outputting the bit line equalizing signal; and a bit line equalizing unit configured to equalize a bit line pair in response to the bit line equalizing signal.

In accordance with still another aspect of the present invention, there is provided a method for generating a bit line equalizing signal of a semiconductor memory device, the method including: driving an output terminal of the bit line equalizing signal with an external supply voltage during a first activation period at the beginning of a period where the bit line equalizing signal is enabled; driving the output terminal of the bit line equalizing signal with a high potential voltage higher than the external supply voltage during a second activation period following the first activation period; and driving the output terminal of the bit line equalizing signal with the external supply voltage during a third activation period following the second activation period.

In accordance with still another aspect of the present invention, there is provided a semiconductor memory device, including: a bit line equalizing signal generating unit configured to generate a bit line equalizing signal by using a first supply voltage and a second supply voltage higher than the first supply voltage stage by stage during a period where the bit line equalizing signal is enabled; and a bit line equalizing unit configured to equalize a bit line pair in response to the bit line equalizing signal.

The present invention employs a scheme of using the supply voltage and the pumping voltage in stages during a period where the bit line equalizing signal is enabled. That is, the supply voltage is used at the beginning of the period where the bit line equalizing signal is enabled and then the pumping voltage is used, thereby to improve the speed of equalizing a bit line pair and power consumption. Furthermore, it is possible to enhance an active speed by reusing the supply voltage after using the pumping voltage for a certain period. The present invention uses the pumping voltage during a core period where an equalizing operation is performed. Therefore, the equalizing speed and the active speed are improved while minimizing the power consumption.

DESCRIPTION OF SPECIFIC EMBODIMENTS

Figure 1:
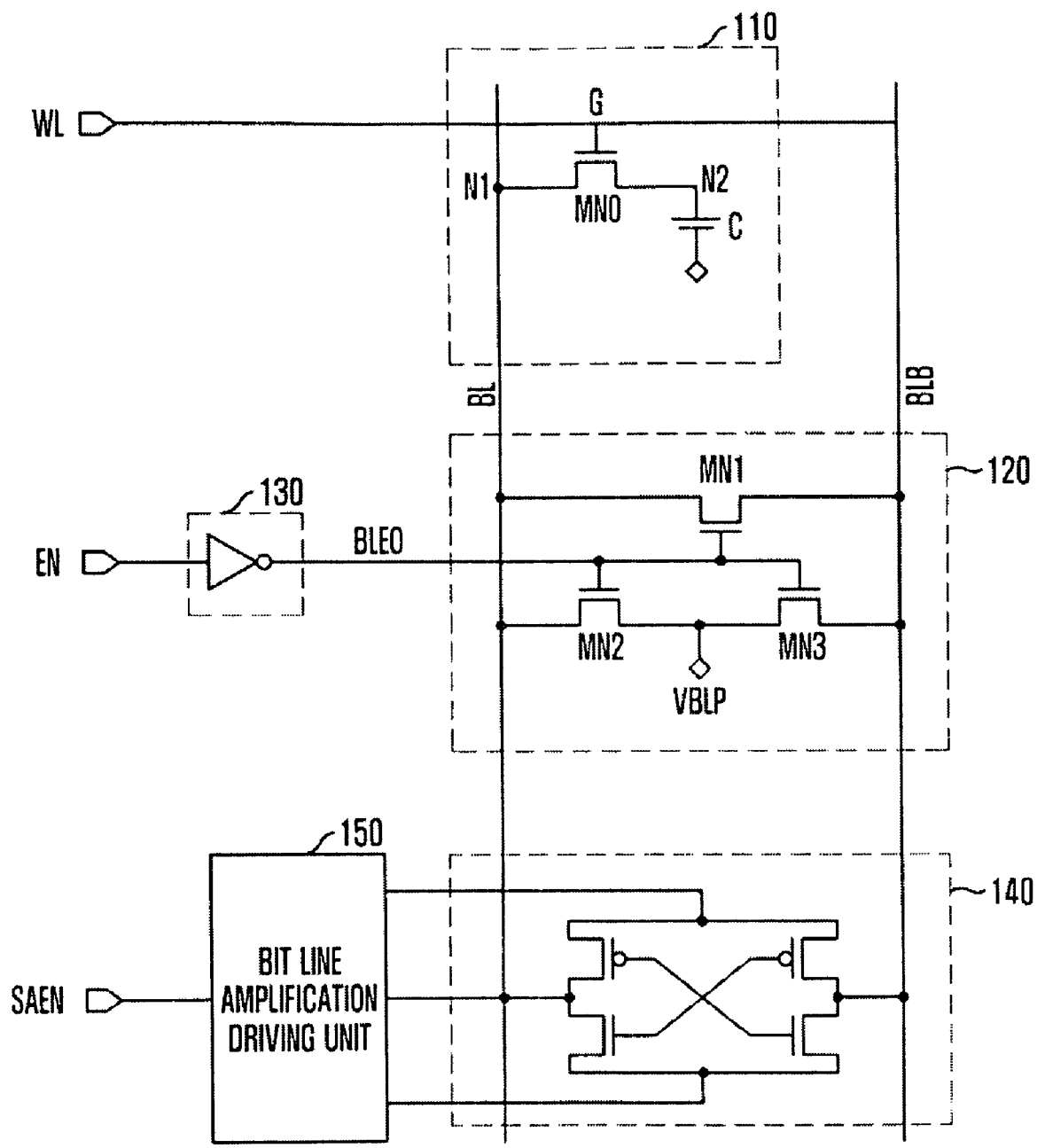
FIG. 1 illustrates a diagram of a typical semiconductor memory device.
Figure 2:
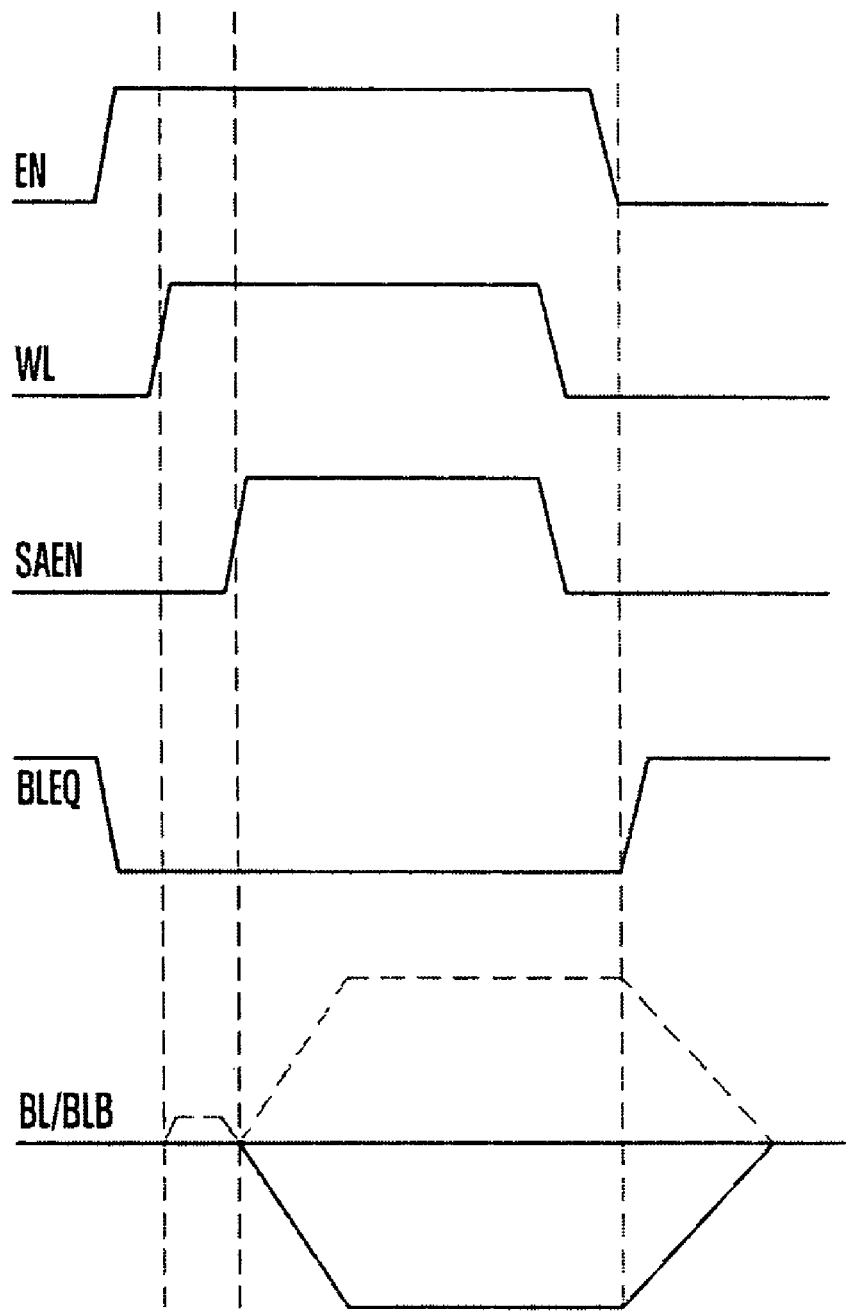
FIG. 2 illustrates a timing diagram for an operation of the semiconductor device illustrated in FIG. 1.

Other objects and advantages of the present invention can be understood by the following description, and become apparent with reference to the embodiments of the present invention.

In general, a logic signal of a circuit is classified as having either a high level or a low level according to its voltage level and is respectively represented as '1' or '0'. Moreover, according to needs, the logic signal may have a high impedance (HI-Z) state. In the embodiments of the present invention, p-channel metal oxide semiconductor (PMOS) and n-channel metal oxide semiconductor (NMOS) are metal oxide semiconductor field effect transistor (MOSFET) that can be used.

A semiconductor memory device in accordance with an embodiment of the present invention includes a bit line equalizing signal generating unit and a bit line equalizing unit. The bit line equalizing signal generating unit drives its output terminal with a first supply voltage during a first activation period of a period where a bit line equalizing signal BLEQ is enabled, and drives the output terminal with a second supply voltage during a second activation period following the first activation period, thereby outputting the bit line equalizing signal BLEQ, wherein the second supply voltage is higher than the first supply voltage. The bit line equalizing unit equalizes a bit line pair BL and BLB in response to the bit line equalizing signal BLEQ. Herein, the first supply voltage is a supply voltage VDD provided from the outside and the second supply voltage is a pumping voltage VPP obtained by boosting the first supply voltage using, e.g., a charge pump.

The above-described semiconductor memory device operates as follows.

First of all, the bit line equalizing signal generating unit drives its output terminal with the first supply voltage during the first activation period at the beginning of the period where the bit line equalizing signal BLEQ is enabled and thus a potential level of the bit line equalizing signal BLEQ rises to the first supply voltage.

Then, during the second activation period following the first activation period, the bit line equalizing signal generating unit drives its output terminal with the second supply voltage higher than the first supply voltage and thus the potential level of the bit line equalizing signal BLEQ rises to the second supply voltage.

The bit line equalizing signal BLEQ generated according to the above scheme makes the bit line pair BL and BLB rapidly equalized in substantially the same speed as that of controlling the bit line equalizing unit using only the pumping voltage VPP. The above control scheme can reduce the current consumption compared to the case of using only the pumping voltage VPP. That is, in an initial rising period of the bit line equalizing signal BLEQ, the signal level of the bit line equalizing signal BLEQ is raised using the supply voltage VDD whose current consumption is relatively low. In a core period where the equalizing operation is executed, the pumping voltage VPP capable of rapidly performing the equalizing operation is used although the pumping voltage VPP induces relatively high current consumption. As a result, the above scheme can increase the equalizing speed while suppressing the current consumption.

A semiconductor memory device in accordance with another embodiment of the present invention includes a bit line equalizing signal generating unit and a bit line equalizing unit. The bit line equalizing signal generating unit drives its output terminal with a first supply voltage during a first activation period of a period where a bit line equalizing signal BLEQ is enabled, drives the output terminal with a second supply voltage during a second activation period following the first activation period, and drives the output terminal with the first supply voltage during a third activation period following the second activation period, thereby outputting the bit line equalizing signal BLEQ, wherein the second supply voltage is higher than the first supply voltage. The bit line equalizing unit equalizes a bit line pair BL and BLB in response to the bit line equalizing signal BLEQ. Herein, the first supply voltage is the supply voltage VDD provided from the outside and the second supply voltage is the pumping voltage VPP obtained by boosting the first supply voltage using, e.g., a charge pump.

The above-described semiconductor memory device operates as follows.

First of all, the bit line equalizing signal generating unit drives its output terminal with the first supply voltage during the first activation period at the beginning of the period where the bit line equalizing signal BLEQ is enabled and thus a potential level of the bit line equalizing signal BLEQ rises to the first supply voltage.

Then, in the second activation period following the first activation period, the bit line equalizing signal generating unit drives its output terminal with the second supply voltage higher than the first supply voltage and thus the potential level of the bit line equalizing signal BLEQ rises to the second supply voltage.

Finally, in the third activation period following the second activation period, the bit line equalizing signal generating unit drives its output terminal with the first supply voltage again to make the potential level of the bit line equalizing signal BLEQ maintain the first supply voltage.

The bit line equalizing signal BLEQ generated according to the above scheme makes the bit line pair BL and BLB rapidly equalized in substantially the same speed as that of controlling the bit line equalizing unit using only the pumping voltage. Furthermore, since the time required to drop the supply voltage VDD level of the bit line equalizing signal BLEQ to the ground voltage VSS level is short, the speed of inactivating the bit line equalizing unit in the active operation is higher than that of when using the pumping voltage VPP. The above control scheme can reduce the current consumption compared to the case of using only the pumping voltage VPP. That is, in an initial rising period of the bit line equalizing signal BLEQ, the signal level of the bit line equalizing signal is raised using the supply voltage VDD whose current consumption is relatively low. In a core period where the equalizing operation is executed, the pumping voltage VPP capable of rapidly performing the equalizing operation is used although the pumping voltage VPP induces relatively high current consumption. After then, the above scheme uses again the supply voltage VDD whose current consumption is low. As a result, the above scheme can increase the equalizing speed and the active speed while suppressing the current consumption to the full.

Hereinafter, the above bit line equalizing signal generating unit will be described in detail.

Figure 3:
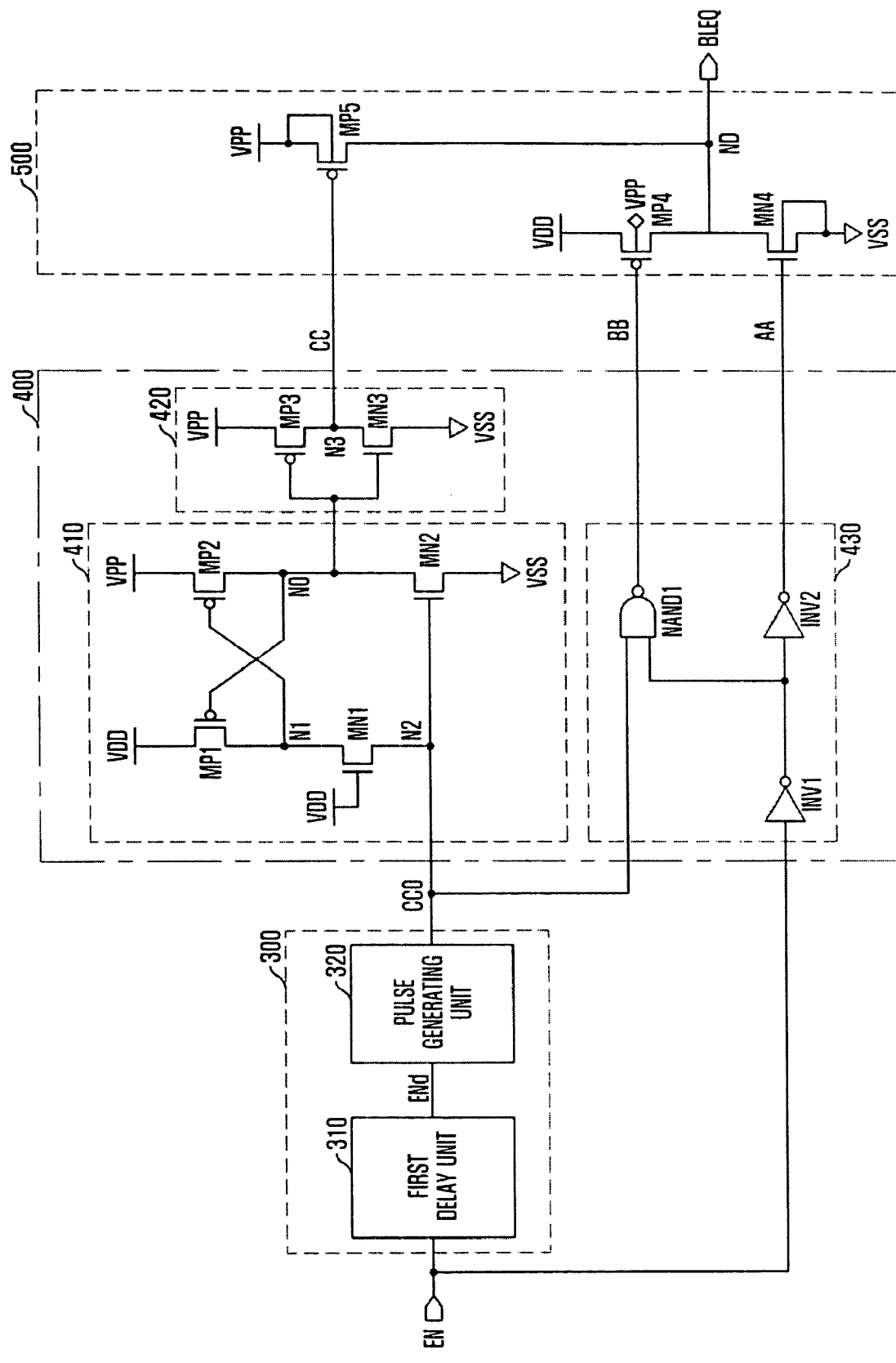
FIG. 3 illustrates a circuit diagram of a bit line equalizing signal generating unit in accordance with an embodiment of the present invention.

FIG. 3 illustrates a circuit diagram of a bit line equalizing signal generating unit in accordance with an embodiment of the present invention.

Referring to FIG. 3, the bit line equalizing signal generating unit includes a pulse signal generating unit 300, a drive controlling unit 400, and a driving unit 500.

The pulse signal generating unit 300 produces a pulse signal CC0 pulsing for a certain period by delaying an enable signal EN that is enabled during an active period thereof.

The drive controlling unit 400 generates a first pull-up drive signal BB that is enabled during the third activation period and a first activation period corresponding to a delay period of the enable signal EN, a second pull-up drive signal CC that is enabled during the second activation period corresponding to the pulsing period of the pulse signal CC0, and a pull-down drive signal AA that is enabled during an inactivation period of a bit line equalizing signal BLEQ.

The driving unit 500 drives an output terminal ND in response to the first and the second pull-up drive signals BB and CC and the pull-down drive signal AA.

Herein, the enable signal EN is enabled as a high level in response to an active signal and disabled as a low level in response to a precharge signal. The enable signal EN maintains the high level during the active period of the bit line equalizing signal generating unit.

The detailed configuration and operation of the above bit line equalizing signal generating unit will be described hereinafter.

The pulse signal generating unit 300 includes a first delay unit 310 for delaying the enable signal EN and a pulse generating unit 320 for producing the pulse signal CC0 using an output signal ENd of the first delay unit 310. The first delay unit 310 may be constructed in various configuration using components such as resistors, capacitors and inverters to delay the enable signal EN. The pulse generating unit 320 is constructed as follows.

Figure 4A:
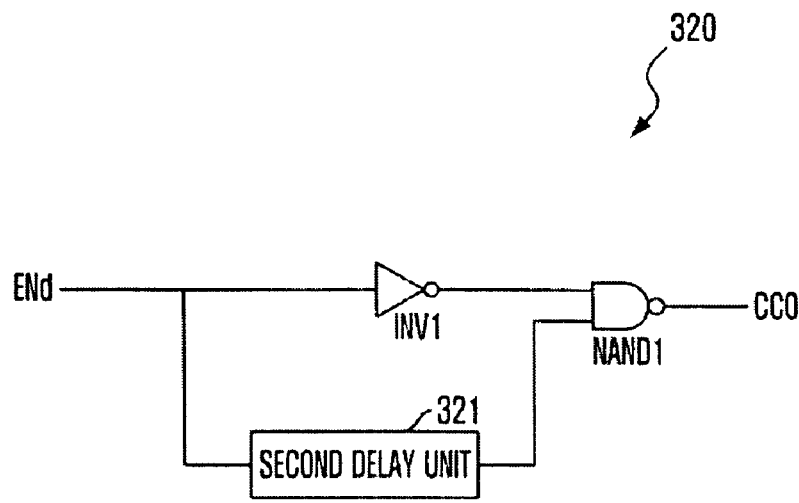
FIG. 4A illustrates a circuit diagram of a pulse generating unit in accordance with an embodiment of the present invention.

FIG. 4A illustrates a circuit diagram of the pulse generating unit of FIG. 3 in accordance with an embodiment of the present invention.

Referring to FIG. 4A, the pulse generating unit 320 includes a first inverter INV1 for inverting the output signal ENd of the first delay unit 310, a second delay unit 321 for delaying the output signal ENd of the first delay unit 310, and a negative logical product gate NAND1 for receiving output signals of the first inverter INV1 and the second delay unit 321 as inputs thereof. Herein, the second delay unit 321 may be constructed in various configurations using components such as resistors, capacitors and inverters to delay the signal ENd. The negative logical product gate uses a NAND gate. Therefore, the pulse signal CC0 outputted from the negative logical product gate NAND1 has a pulsing period whose width corresponds to a delay time of the second delay unit 321.

Figure 4B:
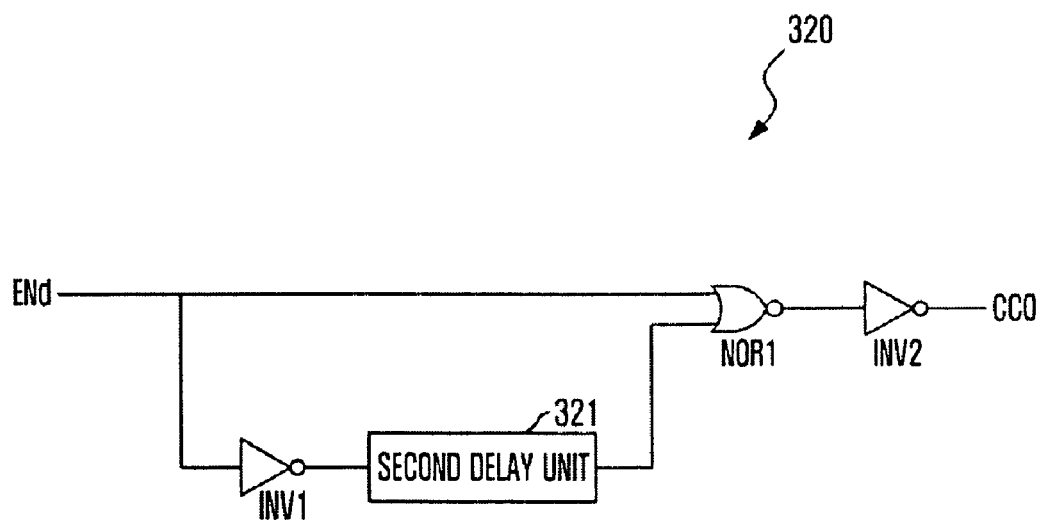
FIG. 4B illustrates a circuit diagram of a pulse generating unit in accordance with another embodiment of the present invention.

FIG. 4B illustrates a circuit diagram of the pulse generating unit of FIG. 3 in accordance with another embodiment of the present invention.

Referring to FIG. 4B, the pulse generating unit 320 includes a first inverter INV1 for inverting the output signal ENd of the first delay unit 310, a second delay unit 321 for delaying an output signal of the first inverter INV1, and a negative logical sum gate NOR1 for receiving the output signal ENd of the first delay unit 310 and an output signal of the second delay unit 321 as inputs thereof, and a second inverter INV2 for inverting an output signal of the negative logical sum gate NOR1. Herein, the negative logical sum gate uses a NOR gate. Therefore, the pulse signal CC0 outputted from the second inverter INV2 has a pulsing period whose width corresponds to a delay time of the second delay unit 321.

Then, the drive controlling unit 400 includes a first level shifting unit 410 for shifting the pulse signal CC0 to the second supply voltage VPP level, an inverting unit 420 for inverting an output signal of the first level shifting unit 410 to output the second pull-up drive signal CC, and a drive generating unit 430 for producing the first pull-up drive signal BB and the pull-down drive signal AA in response to the enable signal EN and the pulse signal CC0.

The first level shifting unit 410 includes a first NMOS transistor MN1, a second NMOS transistor MN2, a first PMOS transistor MP1, and a second PMOS transistor MP2. The first NMOS transistor MN1 is connected between a first connection node N1 and a pulse signal output node N2, and has a gate connected to a first supply voltage VDD terminal. The second NMOS transistor MN2 is connected between a first output node N0 and a ground voltage VSS terminal, and is controlled by the pulse signal CC0. The first PMOS transistor MP1 is connected between the first supply voltage VDD terminal and the first connection node N1 and is controlled by an output signal on the first output node N0. The second PMOS transistor MP2 is connected between a second supply voltage VPP terminal and the first output node N0 and is controlled by an output signal on the first connection node N1.

In the first level shifting unit 410, if the pulse signal CC0 has a high level, the second NMOS transistor MN2 is turned on and thus the output signal of the first level shifting unit 410 on the first output node N0 has a low level. On the other hand, if the pulse signal CC0 has a low level, the second PMOS transistor MP2 is turned on and thus the output signal of the first level shifting unit 410 has a high level. At this time, a potential level of the output signal of the first level shifting unit 410 rises to the second supply voltage VPP. That is, the pulse signal CC0 of the first level shifting unit 410 is shifted to the second supply voltage VPP level and the output signal of the first level shifting unit 410 has a logic state inverted from the pulse signal CC0.

The inverting unit 420 includes a third PMOS transistor MP3 and a third NMOS transistor MN3. The third PMOS transistor MP3 is connected between the VPP terminal and a second output node N3 and is controlled by the output signal on the first output node N0. The third NMOS transistor MN3 is connected between the second output node N3 and the ground voltage VSS terminal and is controlled by the output signal of the first level shifting unit 410 on the first output node N0.

The inverting unit 420 inverts the output signal of the first level shifting unit 410 on the first output node N0 to output the second pull-up drive signal CC. That is, the second pull-up drive signal CC has the same pulsing period as that of the pulse signal CC0 and is obtained by shifting the potential level of the pulse signal CC0 having the first supply voltage VDD to the second supply voltage VPP level.

The drive signal generating unit 430 includes a first inverter INV1 for inverting the enable signal EN, a negative logical product gate NAND1 for receiving an output signal of the first inverter INV1 and the pulse signal CC0 as its inputs to output the first pull-up drive signal BB, and a second inverter INV2 for inverting the output signal of the first inverter INV1 to output the pull-down drive signal AA. The drive signal generating unit 430 outputs the pull-down drive signal AA enabled as a high level when the enable signal EN has a high level. Meanwhile, when the enable signal EN has a low level, the drive signal generating unit 430 outputs the first pull-up drive signal BB enabled as a low level if the pulse signal CC0 has a high level, and the first pull-up drive signal BB disabled as a high level if the pulse signal CC0 has a low level. That is, a period where the first pull-up drive signal BB is enabled is determined by the pulsing period of the pulse signal CC0 and the enable signal EN.

Finally, the driving unit 500 includes a first pull-up PMOS transistor MP4, a pull-down NMOS transistor MN4 and a second pull-up PMOS transistor MP5, thereby outputting the bit line equalizing signal BLEQ through an output terminal ND thereof. The first pull-up PMOS transistor MP4 is connected between the first supply voltage VDD terminal and the output terminal ND and is controlled by the first pull-up drive signal BB. The pull-down NMOS transistor MN4 is connected between the output terminal ND and the ground voltage VSS terminal and controlled by the pull-down drive signal AA. The second pull-up PMOS transistor MP5 is connected between the second supply voltage VPP terminal and the output terminal ND and is controlled by the second pull-up drive signal CC.

Figures 5A, 5B:
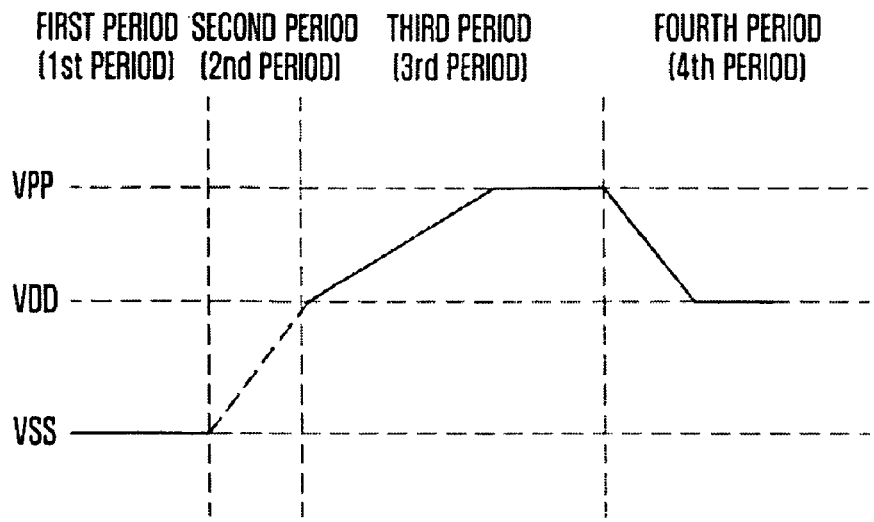
FIGS. 5A and 5B are views illustrating voltage level variation of a bit line equalizing signal according to an operation of a driving unit in accordance with the present invention.

FIGS. 5A and 5B are diagrams illustrating an operation of the bit line equalizing signal generating unit of FIG. 3. FIG. 5A shows voltage level variation of the bit line equalizing signal according to an operation of the driving unit 500.

Referring to FIG. 5A, the driving unit 500 drives the output terminal ND by using the first supply voltage VDD and the second supply voltage VPP in stages according to the period where the bit line equalizing signal BLEQ is enabled, i.e., the second period to the fourth period. That is, during the first activation period of the bit line equalizing signal BLEQ, i.e., the second period, the first pull-up PMOS transistor MP4 is turned on to drive the output terminal ND with the first supply voltage VDD. Then, during the second activation period of the bit line equalizing signal BLEQ, i.e., the third period, the second pull-up PMOS transistor MP5 is turned on to drive the output terminal ND with the second supply voltage VPP. During the third activation period of the bit line equalizing signal BLEQ, i.e., the fourth period, the first pull-up PMOS transistor MP4 is turned on again to drive the output terminal ND with the first supply voltage VDD. During a period where the bit line equalizing signal BLEQ is disabled, i.e., a first period, the pull-down NMOS transistor MN4 is turned on to drive the output terminal ND with the ground voltage VSS. A table 510 in FIG. 5B shows operations of the first pull-up PMOS transistor MP4, the second pull-up PMOS transistor MP5 and the pull-down NMOS transistor MN4 during each of the first to the fourth periods.

Since the output terminal ND of the driving unit 500 is connected to the first pull-up PMOS transistor MP4 and the second pull-up PMOS transistor MP5, the potential level of the output terminal ND rises to the second supply voltage VPP when the second pull-up PMOS transistor MP5 operates. Therefore, to prevent malfunction and enhance stability of the driving unit 500, the first pull-up PMOS transistor MP4 should be supplied with a substrate bias voltage equal to or higher than the second supply voltage VPP.

Generally, the pull-up transistors MP4 and MP5 of the driving unit 500 are constructed with PMOS transistors, but they may be constructed with NMOS transistors instead of the PMOS transistors.

Figure 6:
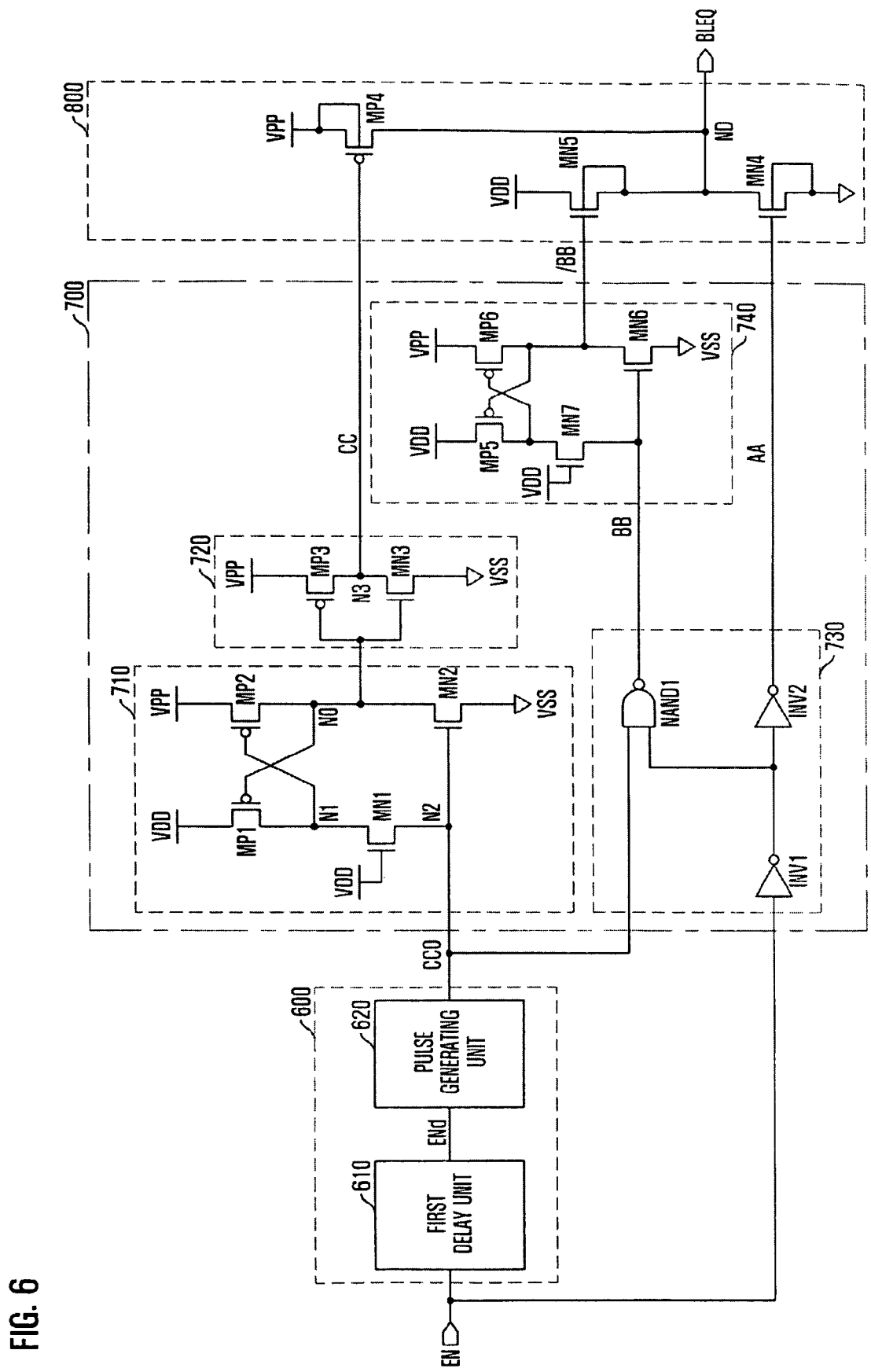
FIG. 6 illustrates a circuit diagram of a bit line equalizing signal generating unit in accordance with another embodiment of the present invention.

FIG. 6 illustrates a circuit diagram of a bit line equalizing signal generating unit in accordance with another embodiment of the present invention.

Referring to FIG. 6, the bit line equalizing signal generating unit includes a pulse signal generating unit 600, a drive controlling unit 700, and a driving unit 800.

The pulse signal generating unit 600 includes a first delay unit 610 for delaying an enable signal EN and a pulse generating unit 620 for producing a pulse signal CC0 based on an output signal ENd of the first delay unit 610.

The drive controlling unit 700 includes a first level shifting unit 710 for shifting the pulse signal CC0 to a second supply voltage VPP level, an inverting unit 720 for inverting an output signal of the first level shifting unit 710 to output a second pull-up drive signal CC, a drive signal generating unit 730 for producing a first pull-up drive signal BB and a pull-down drive signal AA in response to the enable signal EN and the pulse signal CC0, and a second level shifting unit 740 for shifting the first pull-up drive signal BB to the second supply voltage VPP level to output an inverted first pull-up drive signal/BB.

The driving unit 800 includes a first pull-up NMOS transistor MN5 that is connected between a first supply voltage VDD terminal and an output terminal ND and controlled by the inverted first pull-up drive signal/BB, a pull-down NMOS transistor MN4 that is connected between the output terminal ND and a ground voltage VSS terminal and controlled by the pull-down drive signal AA, and a second pull-up PMOS transistor MP4 that is connected between the second supply voltage VPP terminal and the output terminal ND and controlled by the second pull-up drive signal CC.

Unlike the bit line equalizing signal generating unit illustrated in FIG. 3, the above bit line equalizing signal generating unit in accordance with this embodiment uses an NMOS transistor instead of a PMOS transistor to construct the pull-up transistor MN5 of the driving unit 800. In case of constructing the pull-up transistor MN5 with the NMOS transistor, in order to control the first pull-up NMOS transistor MN5, the second level shifting unit 740 is further included to shift the first pull-up drive signal BB to the second supply voltage VPP level and to output the inverted first pull-up drive signal BB. Shifting the first pull-up drive signal BB to the second supply voltage VPP level is to compensate the loss of a threshold voltage Vt of the first pull-up NMOS transistor MN5. The internal structure of the second level shifting unit 740 is the same as that of the first level shifting unit 410 illustrated in FIG. 3 and thus the overlapped explanation therefor is omitted.

Figure 7:
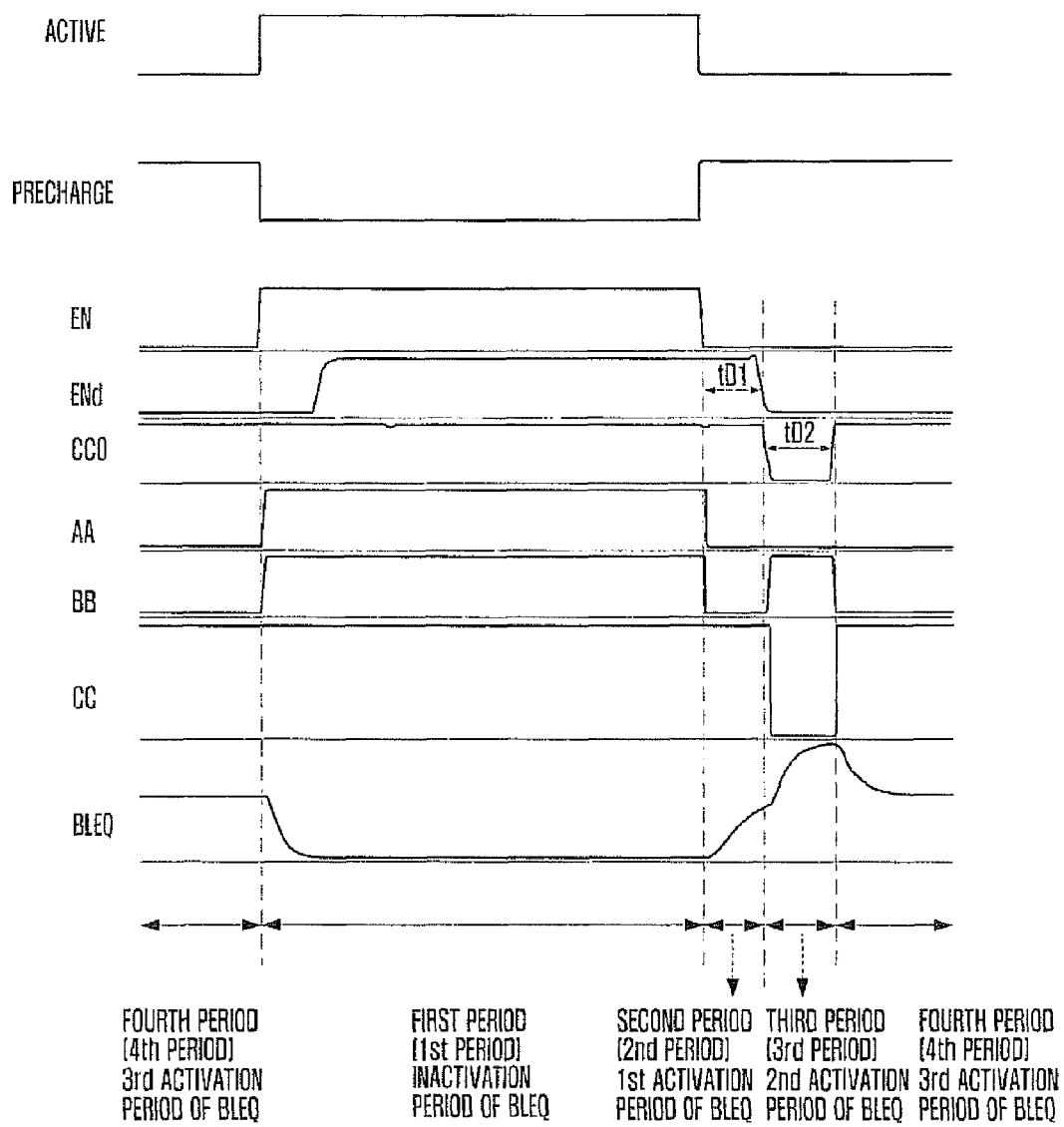
FIG. 7 illustrates a timing diagram for an operation of a bit line equalizing signal generating unit in accordance with the present invention.

FIG. 7 illustrates a timing diagram for an operation of the bit line equalizing signal generating unit in accordance with the present invention.

The operation of the bit line equalizing signal generating unit will be described hereinafter with reference to FIG. 7.

The enable signal EN is a signal that is enabled as a high level in response to an active signal and disabled as a low level in response to a precharge signal. The enable signal EN is a signal that maintains an enabled state of the high level during an active period of the bit line equalizing signal generating unit.

During the first period where the enable signal EN transits to the high level, the pull-down drive signal AA and the first pull-up drive signal BB also have a high level. Therefore, the pull-down NMOS transistor is turned on and the first pull-up P(N)MOS transistor is turned off, so that the bit line equalizing signal BLEQ drops into the ground voltage VSS level. The first period falls on the inactivation period of the bit line equalizing signal BLEQ.

During the second period where the enable signal EN transits to the low level, the pull-down drive signal AA and the first pull-up drive signal BB also have a low level. Therefore, the pull-down NMOS transistor is turned off and the first pull-up P(N)MOS transistor is turned on, so that the bit line equalizing signal BLEQ rises to the first supply voltage VDD level. Since the second period falls on the first activation period of the bit line equalizing signal BLEQ, the second period is determined corresponding to a delay time tD1 of the first delay unit.

Subsequently, during the third period falling on a pulsing period tD2 where the pulse signal CC0 is pulsing to a low level, the first pull-up drive signal BB has a high level and the second pull-up drive signal CC has a low level. Therefore, the first pull-up PMOS or NMOS transistor is turned off and the second pull-up PMOS transistor is turned on, so that the bit line equalizing signal BLEQ rises to the second supply voltage VPP level. Since the third period falls on the second activation period of the bit line equalizing signal BLEQ, the third period is determined corresponding to a delay time tD2 of the second delay unit.

Lastly, during the fourth period where the pulse signal CC0 maintains a high level after the pulsing period tD2, the first pull-up drive signal BB has a low level and the second pull-up drive signal CC has a high level. Therefore, the first pull-up P(N)MOS transistor is turned on and the second pull-up PMOS transistor is turned off, so that the bit line equalizing signal BLEQ transits from the second supply voltage VPP level to the first supply voltage VDD level. The fourth period falls on the third activation period of the bit line equalizing signal BLEQ.

In the embodiments of the present invention, the first supply voltage is the supply voltage VDD provided from the outside and the second supply voltage is the pumping voltage VPP obtained by boosting the first supply voltage using, e.g., a charge pump. If the pumping voltage VPP is generated at the charge pump having efficiency of 50%, in case that current consumed using the pumping voltage VPP is 10 mA, current of 20 mA should be consumed from the supply voltage VDD in order to fill the pumping voltage VPP. Therefore, it is advantageous in the aspect of current to suppress the use of the pumping voltage if possible.

To enhance the performance while suppressing the current consumption to the full, in the first activation period of the bit line equalizing signal BLEQ, the signal level of the bit line equalizing signal BLEQ is raised using the supply voltage VDD whose current consumption is relatively low. In the second activation period falling on a core period where the equalizing operation is executed, the pumping voltage VPP capable of rapidly performing the equalizing operation is used although the pumping voltage VPP induces relatively high current consumption. In the third activation period, it is used again the supply voltage VDD whose current consumption is relatively low. Using the above scheme, it is possible to enhance the equalizing speed and the precharge speed while suppressing the current consumption to the full. That is, in the second activation period, when the bit line equalizing signal BLEQ rises to the pumping voltage VPP level, a portion of the raised voltage is supplied by charge due to the supply voltage VDD and the rest of the raised voltage is supplied by the pumping voltage VPP. In the third activation period, the charge due to the pumping voltage VPP is transferred to the supply voltage VDD, which means that the charge is reused.

As described above, a method for generating the bit line equalizing signal BLEQ of the semiconductor memory device includes a stage of driving the output terminal ND of the bit line equalizing signal BLEQ with the supply voltage VDD during the first activation period at the beginning of the period where the bit line equalizing signal BLEQ is enabled, a stage of driving the output terminal ND of the bit line equalizing signal BLEQ with the pumping voltage VPP higher than the supply voltage VDD during the second activation period following the first activation period, and a stage of driving the output terminal ND of the bit line equalizing signal BLEQ with the supply voltage VDD during the third activation period following the second activation period.

The bit line equalizing signal BLEQ outputted from the bit line equalizing signal generating unit controls the bit line equalizing unit. Generally, the bit line equalizing unit is constructed with transistors that provide the precharge voltage VBLP to the bit line pair BL and BLB under the control of the bit line equalizing signal BLEQ.

Figure 8:
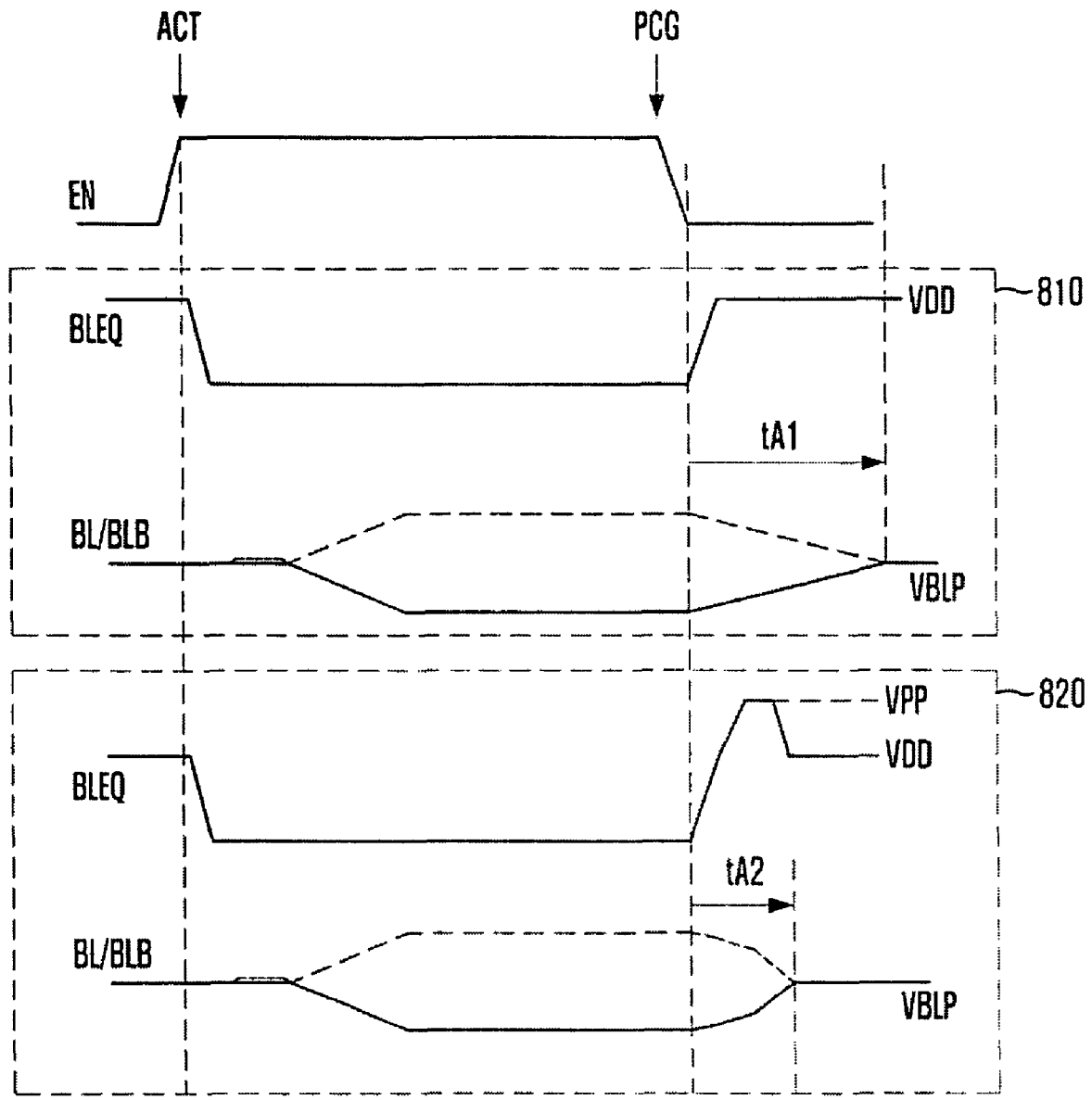
FIG. 8 is a view illustrating an equalizing operation of a bit line pair.

FIG. 8 is a view illustrating an equalizing operation of a bit line pair.

Referring to FIG. 8, when an enable signal EN transits to a low level in response to a precharge signal PCG and thus a bit line equalizing signal BLEQ is enabled as a high level, it is able to confirm a time taken in equalizing the bit line pair BL and BLB with a precharge voltage VBLP. In a conventional scheme 810 using only the supply voltage VDD, a time 'tA1' is taken to equalize the bit line pair BL and BLB. On the other hand, in the inventive scheme 820, a time 'tA2' is taken to perform the same equalization, wherein tA2 is shorter than tA1. That is, the equalizing operation according to the inventive scheme 820 is performed more rapidly compared to the equalizing operation according to the conventional scheme 810.

In accordance with the present invention, the equalizing speed can be enhanced while minimizing the power consumption. Moreover, by improving the equalizing speed and the active speed while minimizing the power consumption, it is possible to enhance the performance of the semiconductor memory device.

While the present invention has been described with respect to the specific embodiments, it will be apparent to those skilled in the art that various changes and modifications may be made without departing from the spirit and scope of the invention as defined in the following claims.

For instance, the configuration to active high or active low for representing the enablement of a signal may vary according to embodiments. Moreover, the configuration of transistors may be changed according to needs to accomplish the same function. That is, the configuration of PMOS transistors and that of NMOS transistors may be replaced with each other and various transistors may be used according to needs. Since such a circuit change has too many numbers of cases and the modifications therefor can be readily analogized by those skilled in the art, they are not listed herein.

What is claimed is:

1. A semiconductor memory device, comprising:
a bit line equalizing signal generating unit, configured to drive an output terminal with a first supply voltage during a first activation period at the beginning of a period where a bit line equalizing signal is enabled, and to drive the output terminal with a second supply voltage higher than the first supply voltage during a second activation period following the first activation period, thereby outputting the bit line equalizing signal; and
a bit line equalizing unit configured to equalize a bit line pair in response to the bit line equalizing signal,
wherein the bit line equalizing signal generating unit includes:
a pulse signal generating unit configured to generate a pulse signal pulsing in a certain period by delaying an enable signal that is enabled corresponding to an active period, wherein the certain period corresponds to the second activation period;
a drive controlling unit configured to generate a first pull-up drive signal that is enabled during the first activation period, a second pull-up drive signal that is enabled during the second activation period, and a pull-down drive signal that is enabled during an inactivation period of the bit line equalizing signal in response to the pulse signal and the enable signal; and
a driving unit configured to drive the output terminal in response to the first and second pull-up drive signals and the pull-down drive signal,
wherein the enable signal is enabled in response to an active signal and is disabled in response to a precharge signal.

2. The semiconductor memory device of claim 1, wherein the first supply voltage is an external supply voltage and the second supply voltage is generated based on the first supply voltage.

3. The semiconductor memory device of claim 1, wherein the bit line equalizing unit includes transistors that supply a precharge voltage to the bit line pair under the control of the bit line equalizing signal.

4. The semiconductor memory device of claim 1, wherein the bit line equalizing signal generating unit further performs the operation of driving the output terminal with the first supply voltage during a third activation period following the second activation period.

5. The semiconductor memory device of claim 4, wherein the first supply voltage is an external supply voltage and the second supply voltage is generated based on the first supply voltage.

6. The semiconductor memory device of claim 4, wherein the bit line equalizing unit includes transistors that supply a precharge voltage to the bit line pair under the control of the bit line equalizing signal.

7. The semiconductor memory device of claim 1, wherein the pulse signal generating unit includes:
a first delay unit configured to delay the enable signal; and
a pulse generating unit configured to generate the pulse signal using an output signal of the first delay unit.

8. The semiconductor memory device of claim 7, wherein the pulse generating unit includes:
a first inverter to invert the output signal of the first delay unit;
a second delay unit to delay the output signal of the first delay unit; and
a negative logical product gate to receive output signals of the first inverter and the second delay unit as inputs thereof.

9. The semiconductor memory device of claim 7, wherein the pulse generating unit includes:
a first inverter to invert the output signal of the first delay unit;

a second delay unit to delay an output signal of the first inverter;

a negative logical sum gate to receive the output signal of the first delay unit and an output signal of the second delay unit as inputs thereof; and a second inverter to invert an output signal of the negative logical sum gate.

10. The semiconductor memory device of claim 1, wherein the drive controlling unit includes:

a first level shifting unit configured to shift the pulse signal to the second supply voltage level;

an inverting unit configured to invert an output signal of the first level shifting unit to thereby output the second pull-up drive signal; and a drive signal generating unit configured to generate the first pull-up drive signal and the pull-down drive signal in response to the enable signal and the pulse signal.

11. The semiconductor memory device of claim 10, wherein the first level shifting unit includes:

a first NMOS transistor connected between a first connection node and an output node of the pulse signal, and having a gate connected to a first supply voltage terminal;

a second NMOS transistor connected between a first output node and a ground voltage terminal, and controlled by the pulse signal;

a first PMOS transistor connected between the first supply voltage terminal and the first connection node, and controlled by an output signal on the first output node; and a second PMOS transistor connected between a second supply voltage terminal and the first output node, and controlled by an output signal on the first connection node.

12. The semiconductor memory device of claim 11, wherein the inverting unit includes:

a third PMOS transistor connected between the second supply voltage terminal and a second output node, and controlled by the output signal on the first output node; and a third NMOS transistor connected between the second output node and the ground voltage terminal, and controlled by the output signal on the first output node.

13. The semiconductor memory device of claim 10, wherein the drive signal generating unit includes:

a first inverter to invert the enable signal;

a negative logical product gate to output the first pull-up drive signal based on an output signal of the first inverter and the pulse signal; and a second inverter to invert the output signal of the first inverter to thereby output the pull-down drive signal.

14. The semiconductor memory device of claim 13, wherein the driving unit includes:

a first pull-up PMOS transistor connected between a first supply voltage terminal and the output terminal, and controlled by the first pull-up drive signal;

a pull-down NMOS transistor connected between the output terminal and a ground voltage terminal, and controlled by the pull-down drive signal; and a second pull-up PMOS transistor connected between a second supply voltage terminal and the output terminal, and controlled by the second pull-up drive signal.

15. The semiconductor memory device of claim 14, wherein the first pull-up PMOS transistor is supplied with a substrate bias voltage corresponding to the second supply voltage level.

16. The semiconductor memory device of claim 13, wherein the drive controlling unit further includes a second level shifting unit configured to shift the first pull-up drive signal to the second supply voltage level to thereby generate the inverted first pull-up drive signal.

17. The semiconductor memory device of claim 16, wherein the driving unit includes:

a first pull-up NMOS transistor connected between a first supply voltage terminal and the output terminal, and controlled by the inverted first pull-up drive signal;

a pull-down NMOS transistor connected between the output terminal and a ground voltage terminal, and controlled by the pull-down drive signal; and a second pull-up PMOS transistor connected between a second supply voltage terminal and the output terminal, and controlled by the second pull-up drive signal.

18. The semiconductor memory device of claim 16, wherein the second level shifting unit includes:

a first NMOS transistor connected between a first connection node and an output node of the first pull-up drive signal, and having a gate connected to a first supply voltage terminal;

a second NMOS transistor connected between a first output node and a ground voltage terminal, and controlled by the first pull-up drive signal;

a first PMOS transistor connected between the first supply voltage terminal and the first connection node, and controlled by an output signal on the first output node; and a second PMOS transistor connected between a second supply voltage terminal and the first output node, and controlled by an output signal on the first connection node.

19. A semiconductor memory device, comprising:

a pulse signal generating unit, configured to generate a pulse signal in response to an enable signal;

a normal driving unit configured to generate a bit line equalizing signal with a first supply voltage in response to the pulse signal and the enable signal;

an overdriving unit configured to generate a bit line equalizing signal with a second supply voltage higher than the first supply voltage in response to the pulse signal; and a bit line equalizing unit configured to equalize a bit line pair in response to the bit line equalizing signal, wherein the bit line equalizing signal has the first supply voltage in a first activation period of a precharge operation period, has the second supply voltage in a second activation period of the precharge operation period directly following the first activation period, and has the first supply voltage in a third activation period of the precharge operation period directly following the second activation period, wherein the overdriving unit includes:

a firs level shifting unit configured to shift the pulse signal to the second supply voltage;

an inverting unit configured to invert an output signal of the first level shifting unit to thereby output a second pull-up drive signal; and a second pull-up unit configured to generate the bit line equalizing signal with the second supply voltage in response to the second pull-up drive signal.

20. The semiconductor memory device of claim 19, wherein the first supply voltage is an external supply voltage and the second supply voltage is generated based on the first supply voltage.

21. The semiconductor memory device of claim 19, wherein the pulse signal generating unit includes:

a first delay unit configured to receive and delay the enable signal; and a pulse generating unit configured to generate the pulse signal using an output signal of the first delay unit.

22. The semiconductor memory device of claim 19, wherein the normal driving unit includes:
   a drive signal generating unit configured to generate a first pull-up signal and a pull-down drive signal in response to the enable signal and the pulse signal;
   a first pull-up unit configured to generate the bit line equalizing signal with the first supply voltage level in response to the first pull-up signal; and
   a pull-down unit to discharge the output terminal in response to the pull-down drive signal.

23. The semiconductor memory device of claim 19, wherein the precharge operation period is an activation period of the bit line equalization signal, the first through third activation periods are different periods within the activation period of the bit line equalization signal, the normal driving unit is configured to supply the first supply voltage during the first and third activation periods, and the overdriving unit is configured to supply the second supply voltage during the second activation period.

24. The semiconductor memory device of claim 19, wherein the first through third activation periods together constitute a continuous period that is not interrupted by an intervening period located between the first through third activation periods.

* * * * *